(12) United States Patent
Bowman et al.

(10) Patent No.: US 7,474,088 B2
(45) Date of Patent: Jan. 6, 2009

(54) POWER MONITORING SYSTEM

(75) Inventors: Marc Bowman, McMinnville, OR (US);
David Bruno, Portland, OR (US);
Marshall Mauney, Lake Oswego, OR (US)

(73) Assignee: Veris Industries, LLC, Portland, OR (US)

( * ) Notice: Subject to any disclaimer, the term of this patent is extended or adjusted under 35 U.S.C. 154(b) by 0 days.

(21) Appl. No.: 11/786,642

(22) Filed: Apr. 11, 2007

(65) Prior Publication Data

US 2007/0194777 A1 Aug. 23, 2007

Related U.S. Application Data

(62) Division of application No. 10/109,145, filed on Mar. 26, 2002, now Pat. No. 7,221,145.

(60) Provisional application No. 60/335,230, filed on Nov. 30, 2001.

(51) Int. Cl.
*G01R 7/00* (2006.01)
(52) U.S. Cl. .................................................. 324/142
(58) Field of Classification Search ................. None
See application file for complete search history.

(56) References Cited

U.S. PATENT DOCUMENTS

| | | | |
|---|---|---|---|
| 4,709,339 A | 11/1987 | Fernandes | |
| 4,999,575 A | 3/1991 | Germer | |
| 5,337,206 A | 8/1994 | Kadah et al. | |
| 5,467,012 A | 11/1995 | Nystrom | |
| 5,861,683 A * | 1/1999 | Engel et al. | 361/601 |
| 5,880,677 A * | 3/1999 | Lestician | 340/870.02 |
| 5,995,911 A * | 11/1999 | Hart | 324/126 |
| 6,064,192 A * | 5/2000 | Redmyer | 324/127 |
| 6,137,418 A | 10/2000 | Zuercher et al. | |
| 6,236,949 B1 | 5/2001 | Hart | |
| 6,330,516 B1 | 12/2001 | Kammeter | |
| 6,373,238 B2 * | 4/2002 | Lewis et al. | 324/107 |
| 6,737,854 B2 | 5/2004 | Bruno et al. | |
| 6,809,509 B2 * | 10/2004 | Bruno et al. | 324/157 |
| 6,825,771 B2 | 11/2004 | Bruno et al. | |
| 6,937,003 B2 * | 8/2005 | Bowman et al. | 324/117 R |
| 7,221,145 B2 * | 5/2007 | Bowman et al. | 324/142 |
| 2004/0227503 A1 | 11/2004 | Bowman et al. | |

* cited by examiner

*Primary Examiner*—Jermele M Hollington
(74) *Attorney, Agent, or Firm*—Chernoff, Vilhauer, McClung & Stenzel

(57) ABSTRACT

A power monitoring system with multiple sensors for electrical panels providing power through multiple electrical conductors. The power monitoring system preferably includes at least four sensors supported in a fixed spatial relationship on a support. The sensors include openings through which electrical conductors may be extended.

13 Claims, 7 Drawing Sheets

- Prior Art -

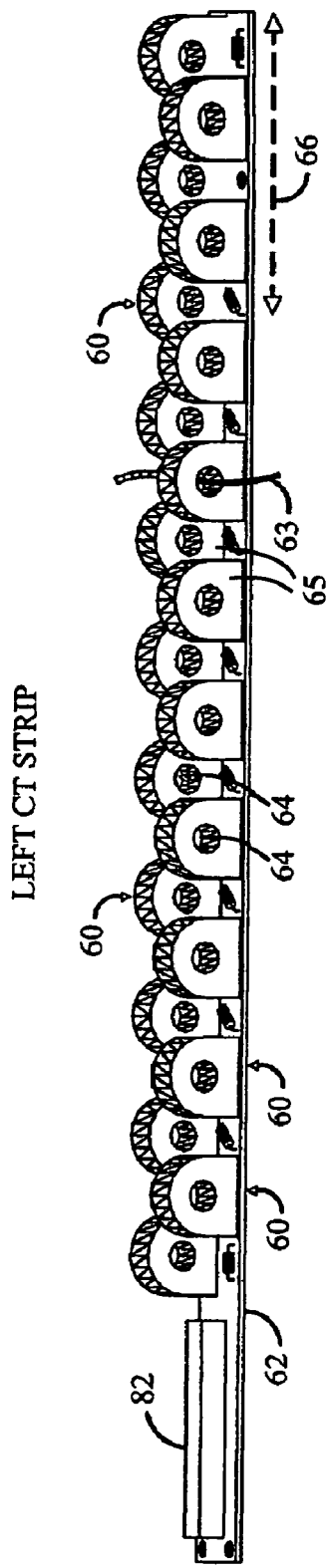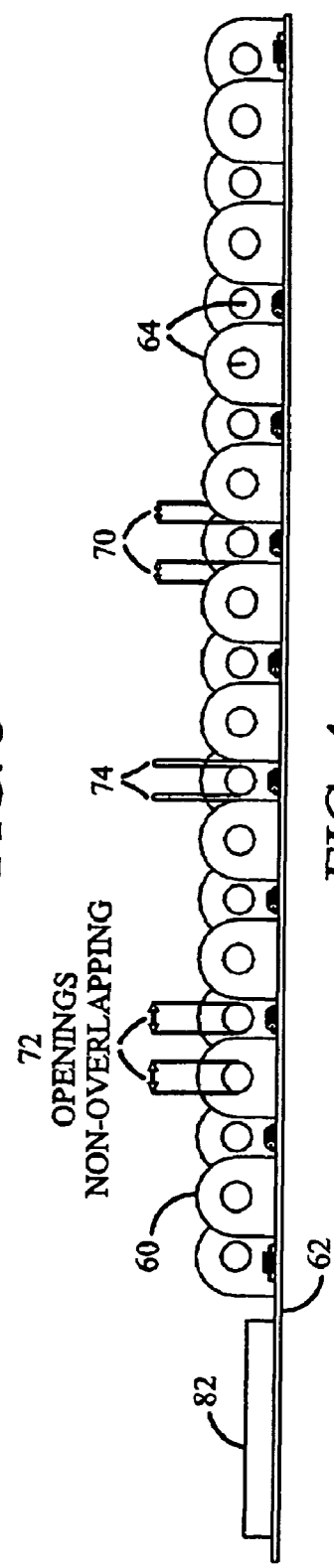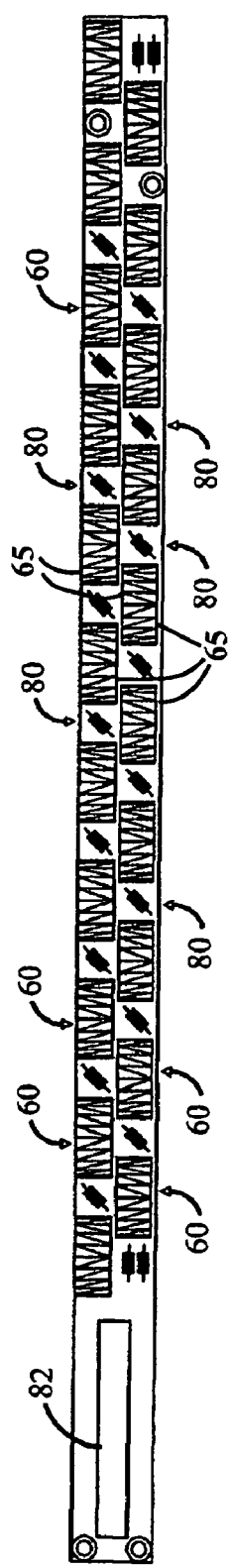

RIGHT CT STRIP

| CONFIGURATION UTILITY | | | | | |
|---|---|---|---|---|---|
| LOAD NUMBER | VOLTAGE | PHASE | ENABLE POWER FACTOR | USE OTHER PHASES | POWER FACTOR PRESET |
| SENSOR 1 | 1 | 1 | A | ✓ | | .71 |
| SENSOR 2 | 1 | 2 | B | ✓ | | .72 |
| SENSOR 3 | 1 | 3 | C | ✓ | | |
| SENSOR 4 | 2 | 2 | B | ✓ | ✓ | |
| SENSOR 5 | 2 | 3 | C | ✓ | ✓ | |
| SENSOR 6 | 3 | 1 | A | ✓ | | |
| SENSOR 7 | 3 | 2 | B | ✓ | | |
| SENSOR 8 | 3 | 3 | C | ✓ | | |
| SENSOR 9 | 6 | 3 | B | | ✓ | |
| SENSOR 10 | 7 | 3 | C | | ✓ | |
| SENSOR 11 | 8 | 2 | A | | | .8 |
| SENSOR 12 | 8 | 1 | B | | | .7 |
| SENSOR 13 | 8 | 3 | C | | | |
| SENSOR 14 | | | | | | |
| SENSOR 15 | | | | | | |

| | | ENABLE | VALUE |
|---|---|---|---|
| VOLTAGE SETTING | PHASE 1 | | |
| | PHASE 2 | ✓ | 122 |
| | PHASE 3 | | |

FIG. 11

POWER MONITORING SYSTEM

CROSS-REFERENCE TO RELATED APPLICATIONS

This application is a division of U.S. patent application, Ser. No. 10/109,145, filed Mar. 26, 2002, now U.S. Pat. No. 7,221,145; which claims the benefit of U.S. Provisional Application, Ser. No. 60/335,230, filed Nov. 30, 2001.

BACKGROUND OF THE INVENTION

The present invention relates to a power monitoring system.

Referring to FIG. 1, many electrical power distribution systems include a panel enclosure 10 into which is provided electrical power using one or more sets of wires 12. The electrical power may have any voltage, any current, and any number of phases (e.g., single phase, two phases, or three phases). Each phase of the electrical power to the power panel is normally provided to a separate bus bar 14a, 14b, and 14c, which are normally elongate conductors within the power panel 10. A plurality of circuit breakers 16a, 16b, 16c, etc., which trip or otherwise selectively disconnect electrical power, are electrically interconnected between one or more of the bus bars 14a, 14b, and 14c, and respective loads 18 external to the power panel 10. In many power panels 10 the circuit breakers 16 are vertically aligned in one or more strips 15. When the load 18 interconnected to a respective circuit breaker 16 within the power panel 10 draws excessive electrical current then the circuit break 16 trips or otherwise disconnects the electrical power to the load 18. In this manner, if a load shorts and thereafter draws excessive current then the circuit breaker will trip. Frequently, the load will be a three-phase load having three wires provided thereto, with one or more corresponding circuit breakers.

In many business environments a set of electrical loads, such as motors, lighting, heating units, cooling units, machinery, etc., may be electrically interconnected to one or more circuits, each of which may be a single phase or multi-phase. Obtaining the total power usage of the business may be readily obtained by reading the power meter provided by the power utility. The power meter is normally electrically interconnected between the power panel and the power utility. In many circumstances, it is desirable to monitor the power consumption of individual loads or groups of loads. The use of power meters permits effective monitoring of the power consumption of particular loads. Also, a set of power meters permits effective sub-metering of different loads, buildings, or groups of loads to attribute and monitor the power usage of the business. For example, the power sub-metering may be used to attribute the power costs charged by the utility to different buildings, departments, or cost centers. The traditional approach to monitoring such power usage is to install a power meter at a location proximate the load itself. To install a typical power meter on a three phase load, a current sensor is located around each wire of the three phases and a voltage connection is electrically interconnected to each wire. Such a power meter is available from Veris Industries, LLC under the name H8035 Power Meter. Unfortunately, it is burdensome to interconnect a significant number of power meters and in particular the voltage connections to the wires, especially if an interconnection to the wires are not readily available. In addition, it is burdensome to interconnect the output of the power meters, if any, to a computer network because of the need to provide communication wiring or other wireless communication channels to each of the remotely located power meters. Also, installing the power meters requires significant expense for the technician to locate a suitable location near each device, in addition to the further expense of servicing the installed power meters.

What is desired, therefore, is an effective power monitoring system.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 3 illustrates a perspective view of an exemplary embodiment of a support for a set of current sensors.

FIG. 4 illustrates a side view of the support and sensors of FIG. 3.

FIG. 5 illustrates a top view of the support and sensors of FIG. 3.

FIG. 11 illustrates the configuration of the current sensors and voltage sensing.

DETAILED DESCRIPTION OF PREFERRED EMBODIMENT

The present inventors reflected on the aforementioned limitations inherent to using multiple independent power meters for a set of loads and came to the realization that a power panel 10 provides a centralized location where the currents in the wires to several different loads may be sensed and the voltage in the bus bars that correspond with the currents may be sensed, with both being readily available. Moreover, unlike traditionally accepted power meters including multiple current sensors and multiple voltage connections for each load to be measured, the present inventors came to the realization that the power provided from the bus bars to multiple different loads has the same voltage potential and phase relationship with respect to each of the different loads. In other words the power factor, which is a phase relationship between the voltage and current provided to a load, may be determined based on the current to the particular load and the voltage in the respective bus bar. For a plurality of different loads the relationship between the respective currents/voltages and power factor may be determined using the same bus bars. This commonality of voltages among different loads may be used as the basis to simplify the power monitoring system. In particular, the power monitoring system may be substantially improved by sensing the voltage potential together with its phase from each of the bus bars, preferably using one and only one electrical interconnection for each phase. The voltage potential together with its phase relationship sensed from one or more bus bars may be used together with the respective sensed currents provided to the different loads to determine the instantaneous power usage and power consumed over a period of time for any particular load. In this manner, only a single interconnection for sensing the voltage potential is necessary for each phase for multiple loads, each of which may have one or more associated current sensors. The use of a single interconnection for sensing the voltage of each phase for multiple different loads decreases the time for installation, the expensive of the power monitoring system, and decreases the likelihood of inadvertently mis-connecting the voltage sensing connections. The use of a generally centralized location for sensing the voltage and current for several different loads potentially permits easier installation of the power monitoring system to a computer network for subsequent processing. Moreover, the centralized location reduces the technicians expense of locating suitable locations for the power meter for a particular load. Further, the servicing of the power meters is more readily done because of their proximity to one another.

Figure 1:
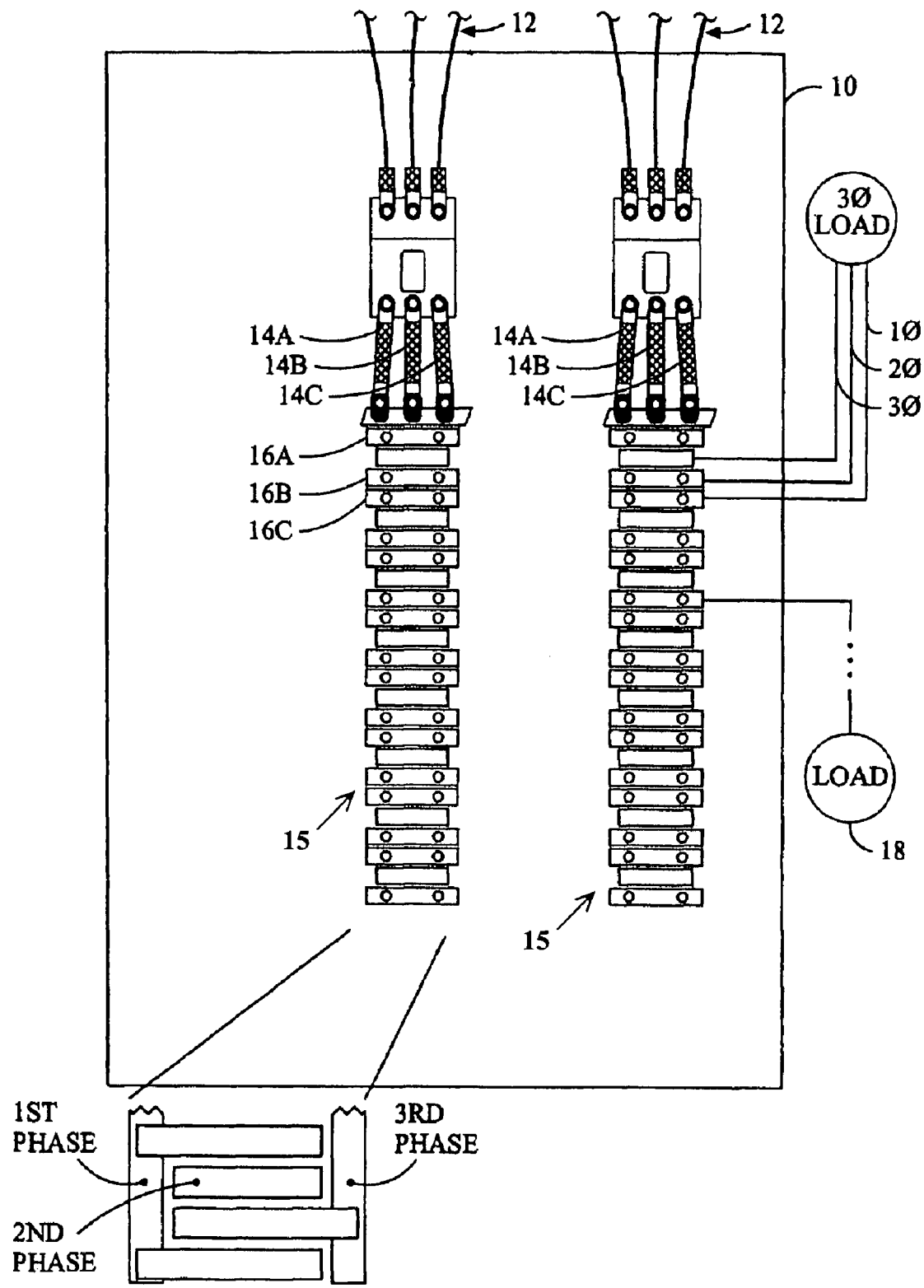
FIG. 1 illustrates a power panel with circuit breakers.
Figure 2:
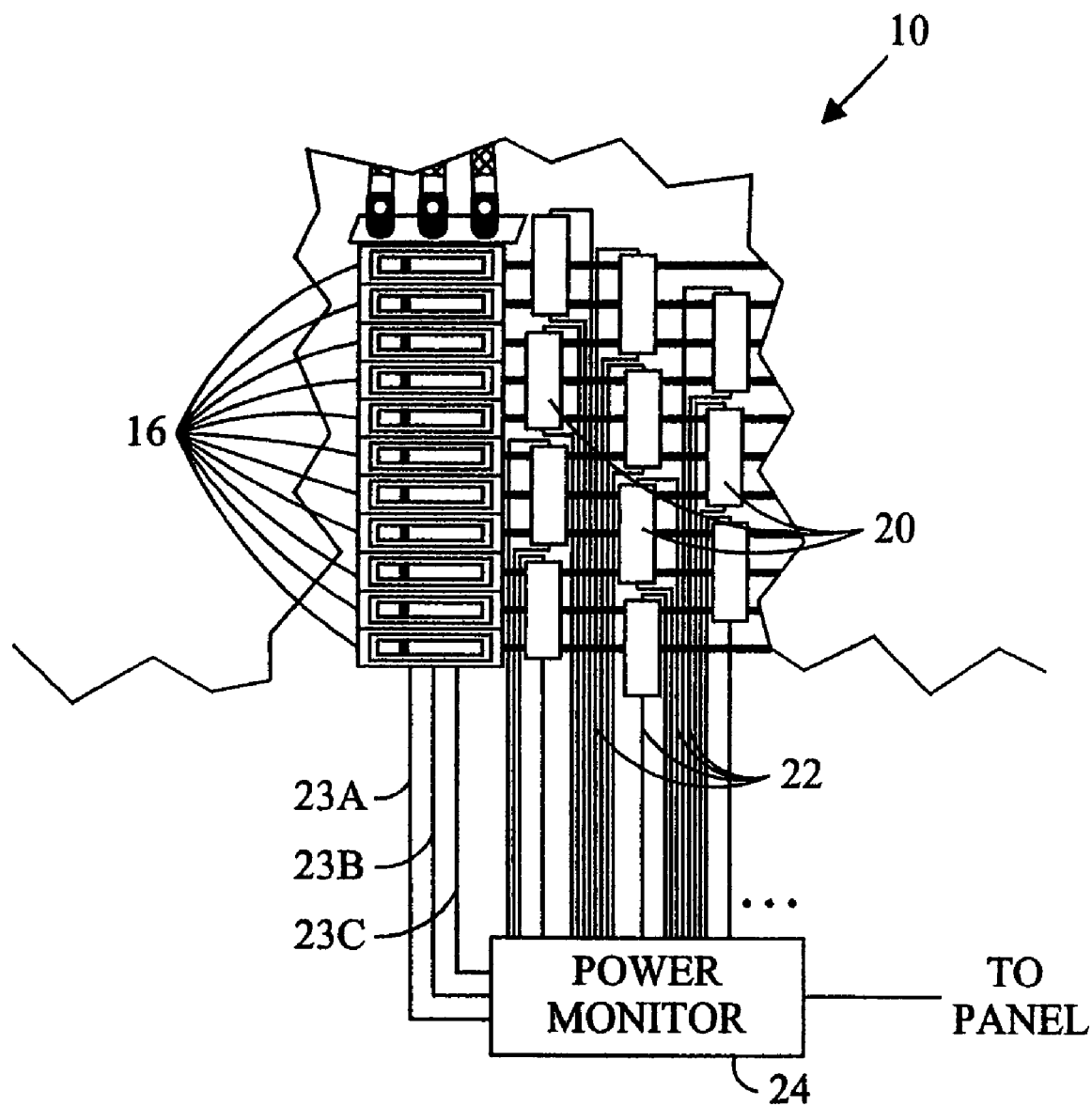
FIG. 2 illustrates circuit breakers, associated sensors, and a power monitor.

Referring to FIG. 2, to monitor the power provided to a particular load from one or more individual circuit breakers 16 a respective current sensor 20 may be interconnected to the wire on the load side of the respective circuit breaker 16. Typical circuit breakers may include a single phase, two phases, or three phases. The outputs 22 of each of the current sensors 20 may be interconnected to a power monitor 24. The current sensors 20 may be interconnected to one or more power monitors. Also, the current sensors 20 may likewise be daisy chained together, or interconnected to the power monitor(s) in any other suitable manner. An electrical interconnection from each bus bar to the power monitor(s) normally includes wires 23a, 23b, 23c to sense the voltage and its corresponding phase relationship. Alternatively, the voltage potential and phase relationship for each phase may be sensed from locations other than the bus bars 14a, 14b, and 14c, such as for example, a wire provided to a load, the load side of a circuit breaker, the utility side of a circuit breaker, a capacitive coupling to the voltage potential, or the wire connection from the utility. It is to be understood that the power monitor may calculate power based upon a single phase, two phases, and/or three phases, etc., as desired. In essence, the power monitoring system may use the electrical path from the power monitor 24 to the bus bars (or otherwise) of at least one of the phases for a plurality of different loads. Typically, the power is calculated by multiplying the voltage, corresponding current, and corresponding power factor which relates to the phase relationship between the voltage and current.

It takes considerable time to install, at significant expense, all of the current sensors 20 and the available space within the power panel 10 may be insufficient for the desired number of current sensors. Also, the limited space available along the circuit breakers 16 may result in significant difficulty installing the current sensors 20, thus requiring lateral spacing of the current sensors and bending the wires from the circuit breakers to different locations within the power panel 10 in an attempt to locate sufficient available space for the current sensors 20. In addition, the large number of wires 22 from the current sensors 20 to the power monitor 24 may require considerable space within the power panel 10. Further, because of the significant number of individual wires 22 an installer has a significant tendency to interconnect the wires 22 to improper places within the power current monitor 24 and in particular to mismatch pairs of wires 22 from the same current sensor 20 rending the current sensors 20 ineffective. Moreover, it is problematic to ensure that the wires 22 indicated by the installer that relate to a particular current sensor 20 actually are interconnected to the desired current sensor 20. In summary, the potential installation problems are significant, especially when install by untrained technicians.

Referring to FIG. 3, a set of sensors 60 may be supported by a support 62 which maintains the current sensors 60 in a fixed spatial relationship with respect to one another. Preferably the support 62 is rigid or semi-rigid, while a flexible support 62 that was installed on a rigid or a semi-rigid supporting member(s) may likewise be used. The sensors 60 are preferably current sensors, or alternatively, other types of sensors may be used. The sensors 60 are preferably wire wound toroidal coils on a metallic or non-metallic core enclosed within a plastic housing that least partially surrounds the respective coil and includes an aperature or openings 64 connecting to the face surfaces 65 of the housing through which a wire 63 may be extended. Changing current within the wire 63 induces a changing magnetic field around the wire 63. The changing magnetic field in turn induces a changing current within the wire wound toroidal coil. The changing current within the toroidal coil may be used directly or converted to any suitable signal, such as for example, a voltage signal, or a different current signal.

The openings 64 defined by the sensors 60 are preferably oriented in a substantially parallel relationship with respect to each other and/or oriented in a substantially perpendicular relationship with respect to the longitudinal axis 66 of the support 62 or otherwise the general alignment of the sensors. Preferably, one set of the aligned sensors have a first linear arrangement and another set of the aligned sensors have a second linear arrangement, which may be parallel to each other. Also, preferably at least two of the aligned sensors have a first linear arrangement and at least two others of the aligned sensors have a second linear arrangement. A single aligned set of sensors 60 may be used or more than two sets of sensors 60 may be used, as desired.

Referring also to FIG. 4, the sensors 60 may be arranged such that the housings surrounding the current sensors have an overlapping region 70 in a substantially perpendicular direction with respect to the longitudinal axis of the support 62 and/or general alignment of the sensors. Preferably, the openings 64 defined by the sensors 60 are in a non-overlapping relationship 72 with respect to one another and a non-overlapping relationship 74 with respect to other housings. This permits the sensors to be arranged in a more compact arrangement within the power panel.

Referring also to FIG. 5, a respective transient voltage suppressor 80 may be interconnected in parallel across the output terminals of each sensor 60. The transient voltage suppressors 80 limits the voltage build up at the terminals of the sensors 60, which may occur if the sensors are sensing a changing magnetic field while the terminals of the sensors 60 are open circuited. This decreases the likelihood that technicians will be the recipient of an unanticipated electrical shock.

Figure 6:
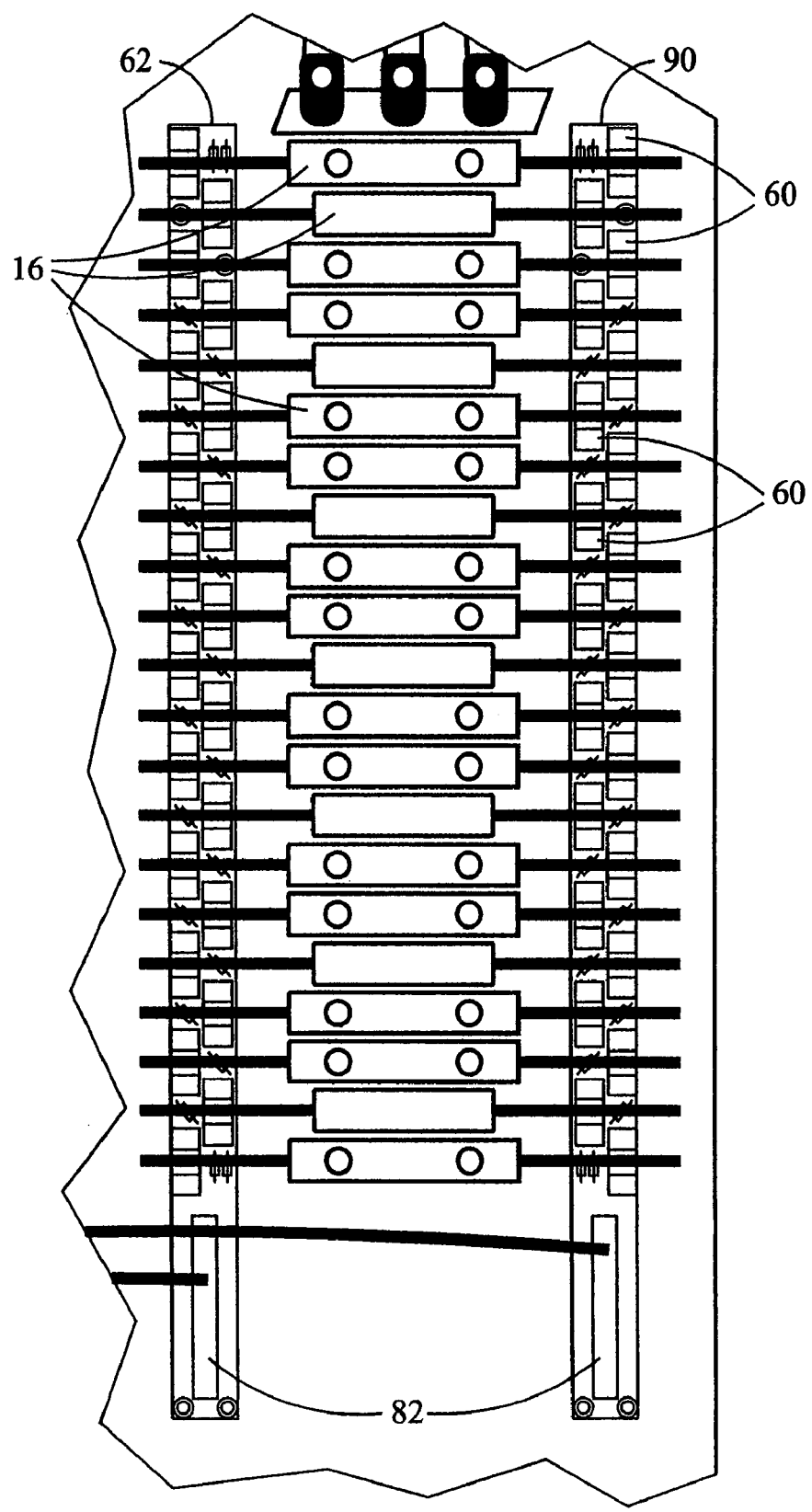
FIG. 6 illustrates a top view of the support and sensors of FIG. 2 together with circuit breakers.

Referring to FIG. 6, the current sensors 60 are preferably arranged in a spatial arrangement such that the openings 64 defined by the current sensors 60 are in a substantially directly opposing relationship with respect to the circuit breakers 16. In other words, the each of the openings 64 is opposing a respective circuit breaker 16. In this manner, the wires from the circuit breakers 16 may be readily routed through a respective sensor 60.

Figure 7:
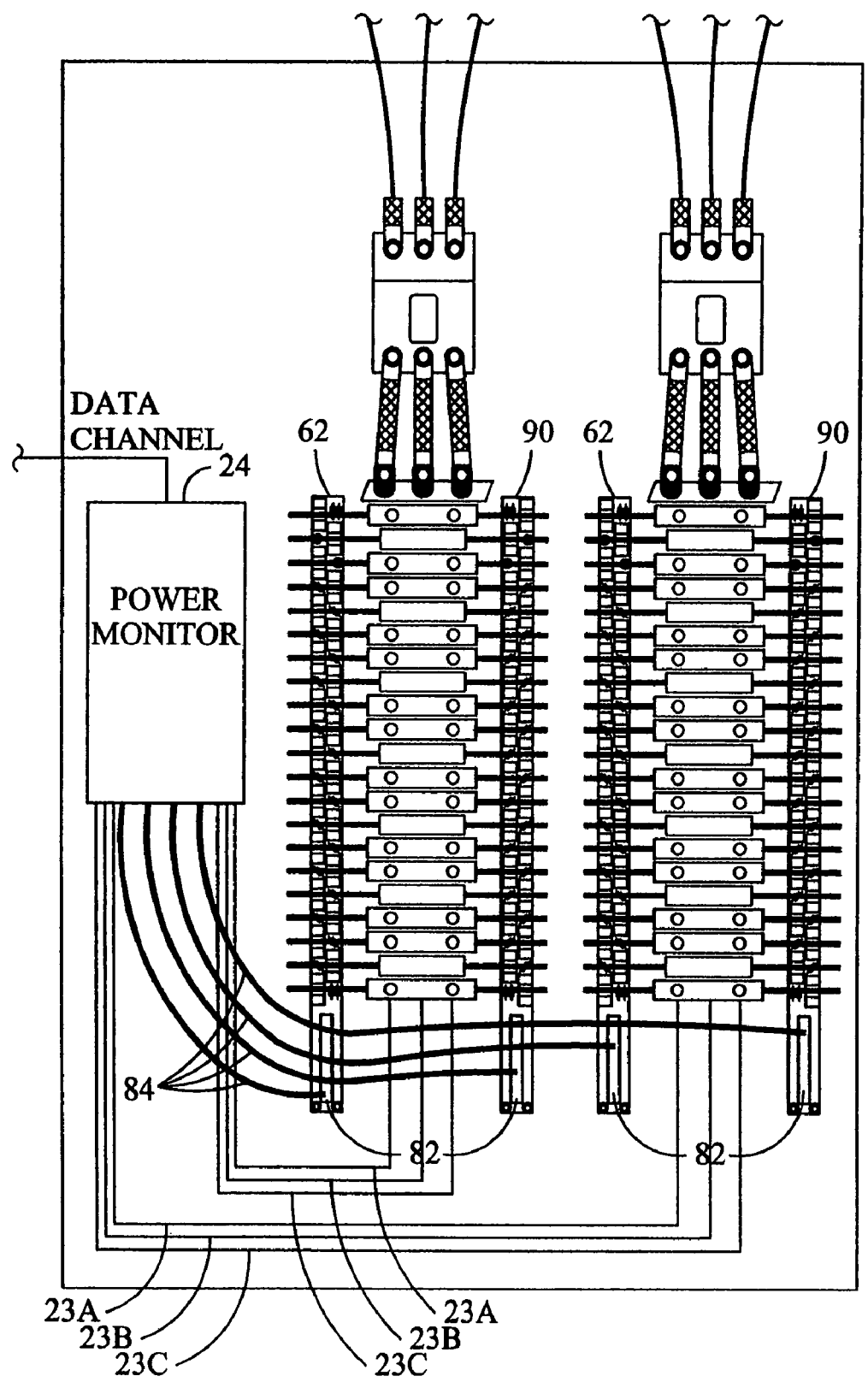
FIG. 7 illustrates a power panel assembly with a power monitor and the support/current sensors of FIG. 3.
Figure 8:
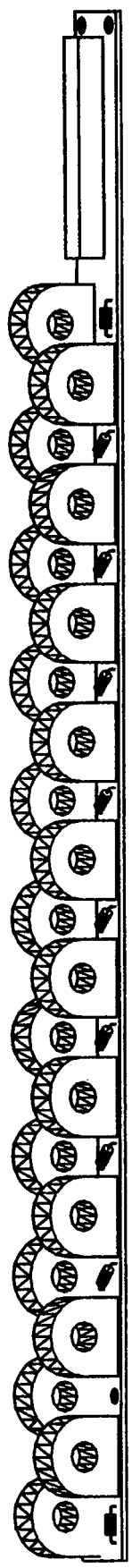
FIG. 8 illustrates a perspective view of another exemplary embodiment of a support for a set of current sensors.
Figure 9:
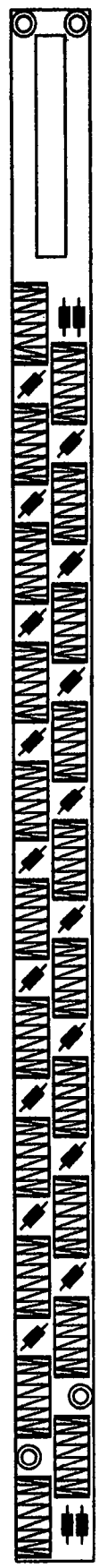
FIG. 9 illustrates a side view of the support and sensors of FIG. 9.
Figure 10:
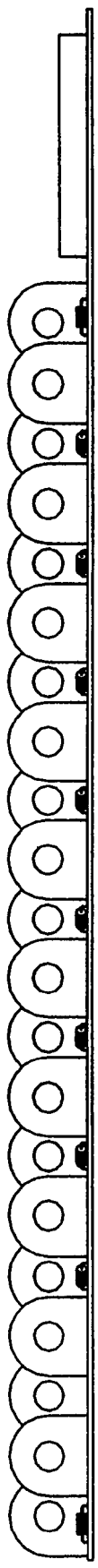
FIG. 10 illustrates a top view of the support and sensors of FIG. 9.

Referring to FIG. 7, during normal installation the support 62 is initially affixed within the power panel in an adjacent spaced apart relationship with respect to a set of circuit breakers 16. A support may be located on both sides of a set of circuit breakers 16, if desired. Another support is illustrated in FIGS. 8, 9, and 10 suitable for the right hand side of the circuit breakers (FIGS. 3, 4, and 5 are suitable for the left hand side). Then, the wires from the loads are passed through the respective sensors and interconnected to a respective circuit breaker 16. In addition, the wires 23a, 23b, and 23c, for sensing the voltage potentials on the bus bars are likewise electrically interconnected. In this manner, the installation of the circuit breakers and the power monitor is efficient, less expensive, economical, and the sensors are in a suitable position with respect to the respective circuit breakers. The support 62 may be suitable for supporting a set of electrical traces that interconnect the sensors 60 to a connector 82. The interconnection from the sensors 60 to the connector 82 are predetermined so that the signals provided to the connector 82 are readily identifiable to the proper sensor 60. This eliminates the potential possibility of improperly interconnecting the wires from the sensors 60 to the connector. A cable 84 interconnects each connector 82 to a power monitor 24. While such a set of supports 62 with respective sensors 60 are suitable for use with new installation, it is difficult to install such a set of sensors 60 to an existing set of circuit breakers with wires already installed. To permit the sensors 60 to be readily interconnected with wires already interconnected to the circuit breakers 16 the sensors 60 may be constructed in a split-core manner. In this manner, the opening 64 may be opened, the wire inserted therein, and the opening 64 closed around substantially all of the wire.

To provide effective monitoring of the power usage used by the loads, the power monitor 24 may monitor the current levels of each of circuit breakers 16 together with the associated voltage potential and phase relationship.

The power monitor 24 may likewise be used to monitor the load balance between the different phases of the power panel 10. Frequently, the circuit breakers may be interconnected to a single phase when the loads require 120 volts, interconnected to two phases when the loads require 240 volts, and interconnected to three phases when the loads require three phase power. For example, the first phase of the power panel 10 may be supplying 70 amps, the second phase of the power panel 10 may be supplying 30 amps, and the third phase of the power panel 10 may be supplying 150 amps. This significant imbalance in the current supplied by the different phases is sub-optimal. For example, the greater the current levels the greater the voltage drop from the power source to the power panel, which may result in significant variations in the voltage levels provided to the power panel from the three phase power source. By monitoring the current (or power) provided from each phase using the sensors, the loads may be redistributed between the different phases to re-balance the loads.

In an alternative embodiment the power factor for one or more phases may be presumed to be a constant value. The power factor (normally the cosine of the phase difference) may be based upon historical measurements, test measurements, anticipated power factor, desired power factor, or otherwise omitted from the calculation of power usage (equivalent to using a power factor of "1").

In an alternative embodiment the power factor, the voltage potential, and/or the current may be calculated, sensed, or otherwise measured for a single phase of a multi-phase load. The power monitor may then use the voltage potential and current, together with the power factor if desired, to calculate the power usage of a multi-phase load by presuming that the remaining phases have similar characteristics. For example, in a three phase system the remaining phases may be presumed to have approximately a 60 degree phase difference. Reusing power calculations for other phases reduces the computation complexity of the power monitor while maintaining relatively accurate power measurements.

In an alternative embodiment, the power factor of a multi-phase load may be determined based upon one of the voltages and one of the currents, both of which are preferably associated with the same phase. The power factor may then be used for all of the phases, if desired. Reusing the calculated power factor reduces the computational complexity of the power monitor while maintaining relatively accurate power measurements.

In an alternative embodiment, the power monitor may, if desired, separate multiple summed alternating voltage signals into their respective phases for power determination, typically by decomposition of the composite signal.

In an alternative embodiment, multiple electrical interconnections may be provided from the power monitor to each of the multiple bus bars or otherwise the voltage potentials of the different phases. Preferably, at least one of the electrical interconnections from the power monitor to at least one of the multiple bus bars, or otherwise the voltage potential of at least one phase, is used together with different current sensors for a plurality of different loads.

In an alternative embodiment, all or a portion of the power monitoring system may be located outside of the power panel.

Referring to FIG. 11 in an alternative embodiment, it may be desirable have the power monitor configurable to select which current sensors correspond to the same load. In addition, the current sensors may be associated with the corresponding sensed voltage. Also, the phase relationship of the current sensors and voltages may be indicated if more than one phase is provided to the load. The use of the currents and voltages, together with the power factor if appropriate, may be used to determine the power usage. The configuration may likewise enable and disable the use of the power factor, if desired. Also, information regarding other phases that are not available may be calculated by the power monitor based upon the other phases. In addition, the power factor and/or voltage may be preset, if desired.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:
1. An electrical sensing device comprising:
   (a) a first sensor comprising a first sensor body including a first sensor surface and defining a first aperture extending through said first sensor body;
   (b) a second sensor comprising a second sensor body attached to said first sensor body, said second sensor body including a second sensor surface and defining a second aperture extending through said second sensor body; and
   (c) a third sensor comprising a third sensor body attached to said second sensor body, said third sensor body including a third sensor surface and defining a third aperture extending through said third sensor body; said first sensor surface, said second sensor surface and said third sensor surface being substantially aligned along a linear axis and said first aperture, said second aperture and said third aperture being spaced in a non-overlapping relationship.
2. The electrical sensing device of claim 1 wherein a central axis of each of said first, said second and said third apertures is arranged substantially normal to said linear axis.

3. The electrical sensing device of claim 1 wherein each of said first, said second and said third sensors includes a toroidal core.

4. The electrical sensing device of claim 1 wherein said first, said second and said third sensors are securable to a surface by securing one of said first, said second and said third sensors to said surface.

5. The electrical sensing device of claim 1 wherein at least one of said first, said second and said third sensors comprises a split toroidal core.

6. The electrical sensing device of claim 1 wherein said first, said second and said third sensors each further comprise a wire wound around a section of a toroidal core, said wires from said first, said second, and said third sensors terminating at a connector secured to one of said first, said second and said third sensor bodies.

7. The electrical sensing device of claim 1 wherein each of said first, said second and said third apertures are further defined by a central axis and said central axes of said first, said second and said third apertures are arranged substantially in a line.

8. The electrical sensing device of claim 1 wherein said second sensor body surface includes a portion overlapped by a portion of said first sensor body surface and another portion overlapped by a portion said third sensor body surface.

9. The electrical sensing device of claim 8 wherein a central axis of each of said first, said second and said third apertures is arranged substantially normal to said linear axis.

10. The electrical sensing device of claim 8 wherein each of said first, said second and said third sensors includes a toroidal core.

11. The electrical sensing device of claim 8 wherein said first, said second and said third sensors are securable to a surface by securing one of said first, said second and said third sensors to said surface.

12. The electrical sensing device of claim 8 wherein said first, said second and said third sensors each further comprise a wire wound around a section of a toroidal core, said wires from said first, said second, and said third sensors terminating at a connector secured to one of said first, said second and said third sensor bodies.

13. The electrical sensing device of claim 8 wherein each of said first, said second and said third apertures are further defined by a central axis and said central axes of said first, said second and said third apertures are arranged substantially in a line.

\* \* \* \* \*

UNITED STATES PATENT AND TRADEMARK OFFICE
CERTIFICATE OF CORRECTION

PATENT NO.         : 7,474,088 B2                                              Page 1 of 1
APPLICATION NO.    : 11/786642
DATED              : January 6, 2009
INVENTOR(S)        : Marc Bowman et al.

It is certified that error appears in the above-identified patent and that said Letters Patent is hereby corrected as shown below:

Col. 4, Line 12

Change: "housing that least" to read: --housing that at least--.

Signed and Sealed this
Fourteenth Day of February, 2012

David J. Kappos
*Director of the United States Patent and Trademark Office*